United States Patent
Chien et al.

(10) Patent No.: US 11,810,939 B2
(45) Date of Patent: Nov. 7, 2023

(54) METHOD OF FORMING BACKSIDE ILLUMINATED IMAGE SENSOR DEVICE WITH SHIELDING LAYER

(71) Applicant: TAIWAN SEMICONDUCTOR MANUFACTURING CO., LTD., Hsinchu (TW)

(72) Inventors: Volume Chien, Tainan (TW); Su-Hua Chang, Chiayi County (TW); Chia-Yu Wei, Tainan (TW); Zen-Fong Huang, Tainan (TW); Chi-Cherng Jeng, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/744,175

(22) Filed: May 13, 2022

(65) Prior Publication Data
US 2022/0271071 A1    Aug. 25, 2022

Related U.S. Application Data

(62) Division of application No. 14/073,580, filed on Nov. 6, 2013, now Pat. No. 11,335,721.

(51) Int. Cl.
*H01L 27/146* (2006.01)
*H01L 31/0216* (2014.01)

(52) U.S. Cl.
CPC .... *H01L 27/1464* (2013.01); *H01L 27/14623* (2013.01); *H01L 27/14627* (2013.01); *H01L 27/14632* (2013.01); *H01L 27/14687* (2013.01); *H01L 31/02164* (2013.01)

(58) Field of Classification Search
None
See application file for complete search history.

(56) References Cited

U.S. PATENT DOCUMENTS

| | | | | |
|---|---|---|---|---|
| 4,948,706 A | * | 8/1990 | Sugihara | G03F 1/56 216/101 |
| 5,125,786 A | | 6/1992 | Baker et al. | |
| 5,128,786 A | * | 7/1992 | Yanagisawa | G02F 1/133512 349/122 |
| 5,414,547 A | * | 5/1995 | Matsuo | G02F 1/136209 349/47 |
| 6,801,293 B1 | * | 10/2004 | Nishiyama | G02F 1/134363 349/187 |

(Continued)

OTHER PUBLICATIONS

Hitosugi et al., "Properties of TIO2-based transparent conductive oxides", Phys. Status Solidi A 207, No. 7, 1529-2537 (2010).

(Continued)

*Primary Examiner* — Vincent Wall
(74) *Attorney, Agent, or Firm* — Birch, Stewart, Kolasch & Birch, LLP

(57) ABSTRACT

A backside illuminated image sensor device with a shielding layer and a manufacturing method thereof are provided. In the backside illuminated image senor device, a patterned conductive shielding layer is formed on a dielectric layer on a backside surface of a semiconductor substrate and surrounding a pixel array on a front side surface of the semiconductor substrate.

20 Claims, 4 Drawing Sheets

(56) References Cited

U.S. PATENT DOCUMENTS

| | | | |
|---|---|---|---|
| 7,030,918 B1* | 4/2006 | Nakashiba | H01L 27/14621 348/294 |
| 7,382,011 B2 | 6/2008 | Noda | |
| 8,023,072 B2* | 9/2011 | Tsubata | G02F 1/133512 349/110 |
| 8,071,429 B1* | 12/2011 | Qian | H01L 27/14687 257/E21.238 |
| 8,207,008 B1* | 6/2012 | Farris, III | H01L 31/03923 438/57 |
| 8,576,318 B2* | 11/2013 | Lee | H01L 27/1462 348/241 |
| 2002/0158294 A1* | 10/2002 | Fujiwara | H01L 27/1463 257/431 |
| 2004/0232459 A1* | 11/2004 | Takayama | H01L 27/1266 257/295 |
| 2005/0030399 A1 | 2/2005 | Suzuki et al. | |
| 2006/0202295 A1 | 9/2006 | Wu et al. | |
| 2007/0023799 A1 | 2/2007 | Boettiger | |
| 2007/0052050 A1* | 3/2007 | Dierickx | H01L 27/14645 257/E21.127 |
| 2007/0205354 A1 | 9/2007 | Li | |
| 2008/0251823 A1* | 10/2008 | Lee | H01L 27/14634 257/292 |
| 2009/0087939 A1* | 4/2009 | Lee | H01L 31/03529 438/57 |
| 2009/0090988 A1* | 4/2009 | Ohgishi | H01L 27/14643 438/73 |
| 2009/0251573 A1 | 10/2009 | Toyoda | |
| 2010/0193845 A1 | 8/2010 | Roy et al. | |
| 2010/0214453 A1 | 8/2010 | Murata | |
| 2011/0187912 A1* | 8/2011 | Arayashiki | H01L 27/1462 257/E31.124 |
| 2011/0304003 A1* | 12/2011 | Tanida | H04N 23/55 257/447 |
| 2012/0120294 A1 | 5/2012 | Nishikido et al. | |
| 2013/0221410 A1 | 8/2013 | Ahn | |
| 2013/0320471 A1* | 12/2013 | Luan | H01L 27/14618 257/E31.127 |
| 2013/0329271 A1 | 12/2013 | Shim | |
| 2014/0070349 A1* | 3/2014 | Oganesian | H01L 27/14687 257/432 |
| 2014/0210029 A1* | 7/2014 | Cheng | H01L 27/14627 438/70 |
| 2016/0225722 A1* | 8/2016 | Honda | H01L 27/14687 |
| 2019/0006237 A1* | 1/2019 | Lee | B23K 3/08 |

OTHER PUBLICATIONS

U.S. Appl. No. 61/788,472, filed Mar. 15, 2013.

* cited by examiner

METHOD OF FORMING BACKSIDE ILLUMINATED IMAGE SENSOR DEVICE WITH SHIELDING LAYER

CROSS-REFERENCES TO RELATED APPLICATION

This application is a divisional application of U.S. patent application Ser. No. 14/073,580 filed Nov. 6, 2013, now U.S. Pat. No. 11,335,721, issued on May 17, 2022, which is incorporated herein in its entirety.

BACKGROUND

Technical Field

The disclosure generally relates to image sensors, especially CMOS image sensors.

Description of Related Art

An image sensor provides an array of pixels for recording an intensity or brightness of light. The pixel responds to the light by accumulating a charge. The more light is received, the higher the charge is accumulated. The charge can then be used by another circuit so that information of color and brightness can be used for a suitable application, such as a digital camera. Common types of pixels include a charge-coupled device (CCD) or complementary metal oxide semiconductor (CMOS) image sensor.

Comparing with conventional front-side illuminated (FSI) sensor, backside illuminated (BSI) sensor has been applied on CMOS image sensor to improve the sensitivity of each pixel in the CMOS image sensor. For CMOS image sensor using backside illumination technology, pixels are located on a front side of a substrate, and the substrate is thinned enough to allow light projected on the backside of the substrate to reach the pixels.

However, during the manufacturing process of the BSI sensor, electrostatic charges are often accumulated, and the wafer used can be easily damaged by the accumulated electrostatic charges in a form of arcing to decrease the yield of the BSI sensor.

DETAILED DESCRIPTION

Figure 1A:
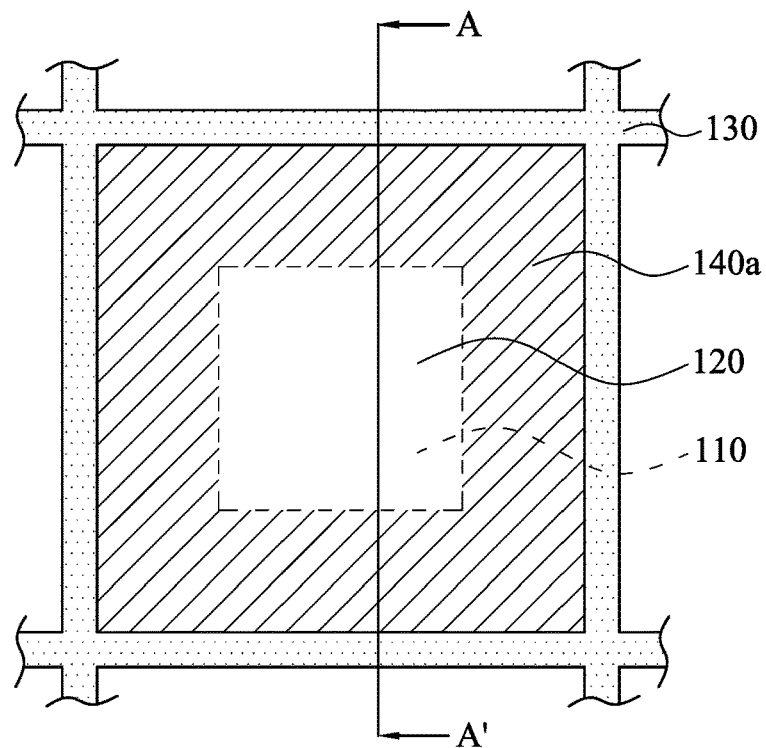
FIGS. 1A-1C are plane diagrams of a backside illuminated image sensor device with a conductive shielding layer according to embodiments of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the process of manufacturing a backside illuminated image sensor device, it is found that a step of developing a photoresist layer on a dielectric layer can generate electrostatic charge accumulated on the dielectric layer. The accumulated electrostatic charge can induce discharging later in any time to damage the pixel array under the dielectric layer. Accordingly, it is designed to form a conductive shielding layer on the dielectric layer to shielding the structures under the conductive shielding layer from outer applied electric field, which may present in a plasma-assisted deposition step or in a plasma-assisted etching step. Then, the discharging behavior of the accumulated electrostatic charges can be reduced or even be prevented.

Figure 1B:
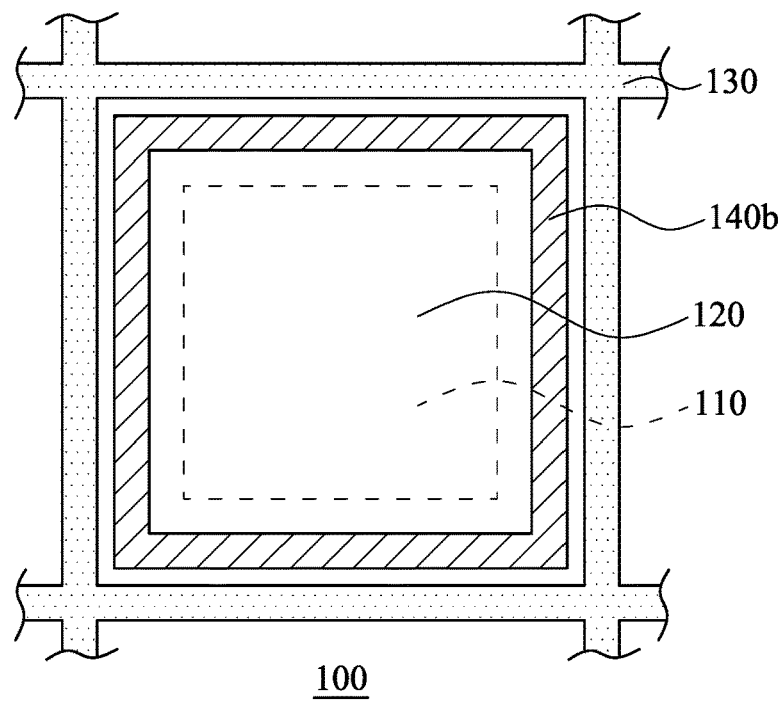
Figure 1C:
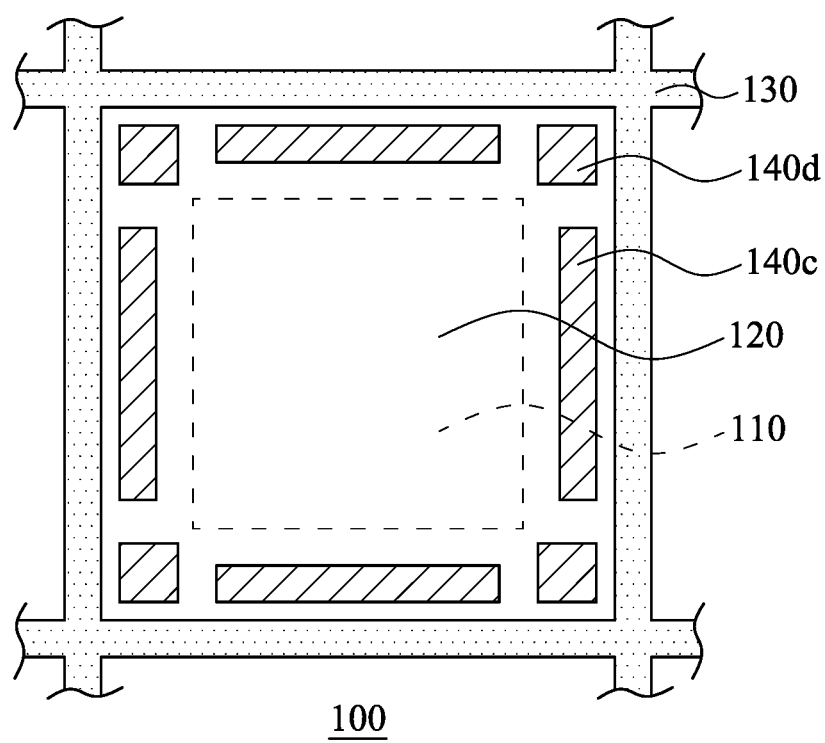

In various embodiments, this disclosure provides a backside illuminated image sensor device with a conductive shielding layer for shielding the structures under the conductive shielding layer from outer applied electric field. FIGS. 1A-1C are plane diagrams of a backside illuminated image sensor device with a conductive shielding layer according to some embodiments of this disclosure. A cross-sectional diagram of the cutting line AA' is shown in FIG. 2B.

Figure 2A:
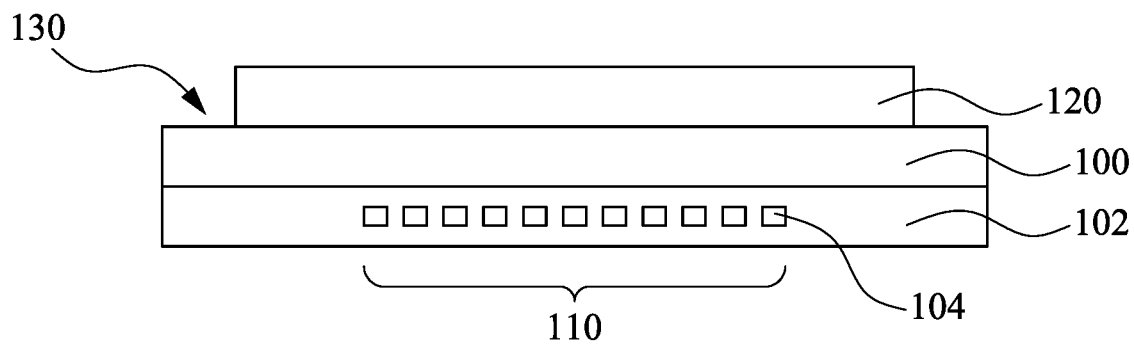
FIGS. 2A-2C are cross-sectional diagrams showing a manufacturing process of a backside illuminated image sensor device with a conductive shielding layer in FIG. 1A.
Figure 2B:
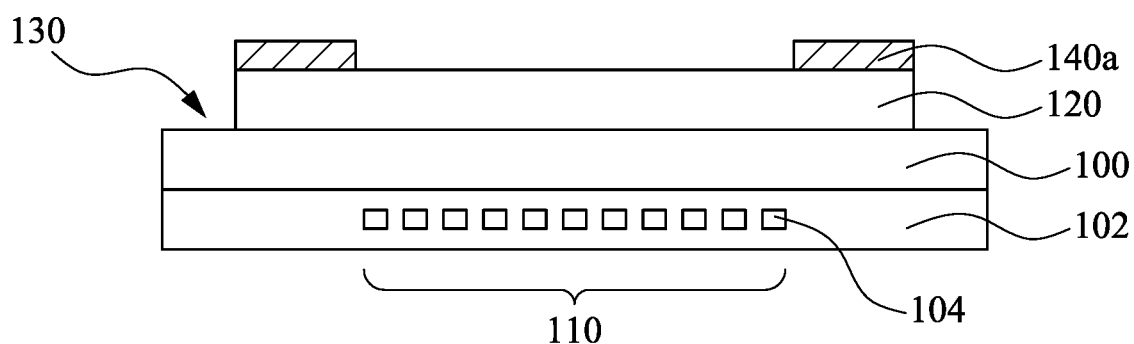

In FIGS. 1A and 2B, a pixel array 110 is disposed on a front surface of a wafer 100. The pixel array 110 includes photodiodes (not shown) in the semiconductor substrate 100 and metal lines 104 in the interconnect layer 102. A dielectric layer 120 is disposed on a back surface of the wafer 100 to cover the backside of the pixel array 110. A plurality of scribe lines 130 are formed in the dielectric layer 120.

A conductive shielding line 140a is disposed on the dielectric layer 120. The conductive shielding line 140a is located on an area between the pixel array 110 and scribe lines 130 and fills the area. Therefore, the conductive shielding line 140a does not stop light irradiating on the pixel array 110 to maximize the light intensity received by the pixel array 110.

In FIG. 1B, the conductive shielding line 140a in FIG. 1A is thinned to the conductive shielding line 140b. However, for maintaining the shielding effect, the line width of the conductive shielding line 140b is at least 300 μm.

The conductive shielding line 140a in FIG. 1A can be further patterned to any patterns as long as the distributed conductive shielding lines is surrounding the pixel array 110 to give protection to the pixel array 110. The shape of the each individual conductive shielding lines viewed from a top direction can be circle, square, polygon, or strip. Still, the narrowest width of the each individual conductive shielding lines is at least 300 μm. For example, the conductive shielding line 140a in FIG. 1A can be patterned to conductive shielding lines 140c in a shape of strip and conductive shielding lines 140d in a shape of square in FIG. 1C.

According to an embodiment of this disclosure, the conductive shielding lines 140a to 140d can be made from a conductive material, such as a metal, a conductive oxide, a conductive polymer, or graphene. The metal can be Al, Cu, Ti, Mo, or a MoCr alloy. The conductive oxide can be AZO (ZnO: Al), GZO (ZnO: Ga), GAZO (ZnO: Ga, Al), ATO ($SnO_2$: Sb), FTO ($SnO_2$: F), or ITO ($In_2O_3$: Sn). The conductive polymer can be poly(3,4-ethylenedioxythiophene) (PEDOT), polyanilines (PANI), or corresponding intrinsically conducting polymers (ICPs).

According to another embodiment of this disclosure, the dielectric layer is made from a dielectric material having a dielectric constant higher than or equal to the dielectric constant of silicon oxide. For example, the dielectric layer can be made from silicon oxide or silicon nitride.

According to another embodiment of this disclosure, the dielectric buffer layer is made from a dielectric material, such as silicon oxide.

Figure 2C:
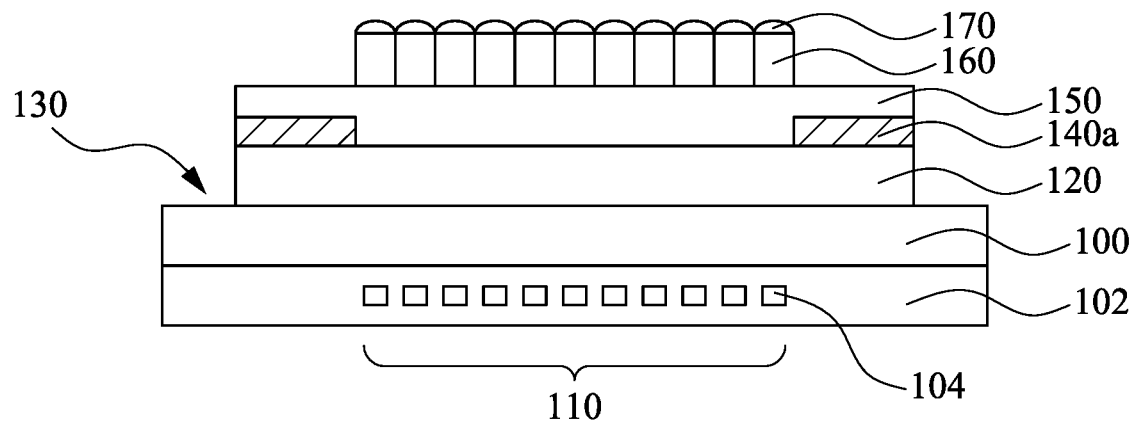
Figure 3:
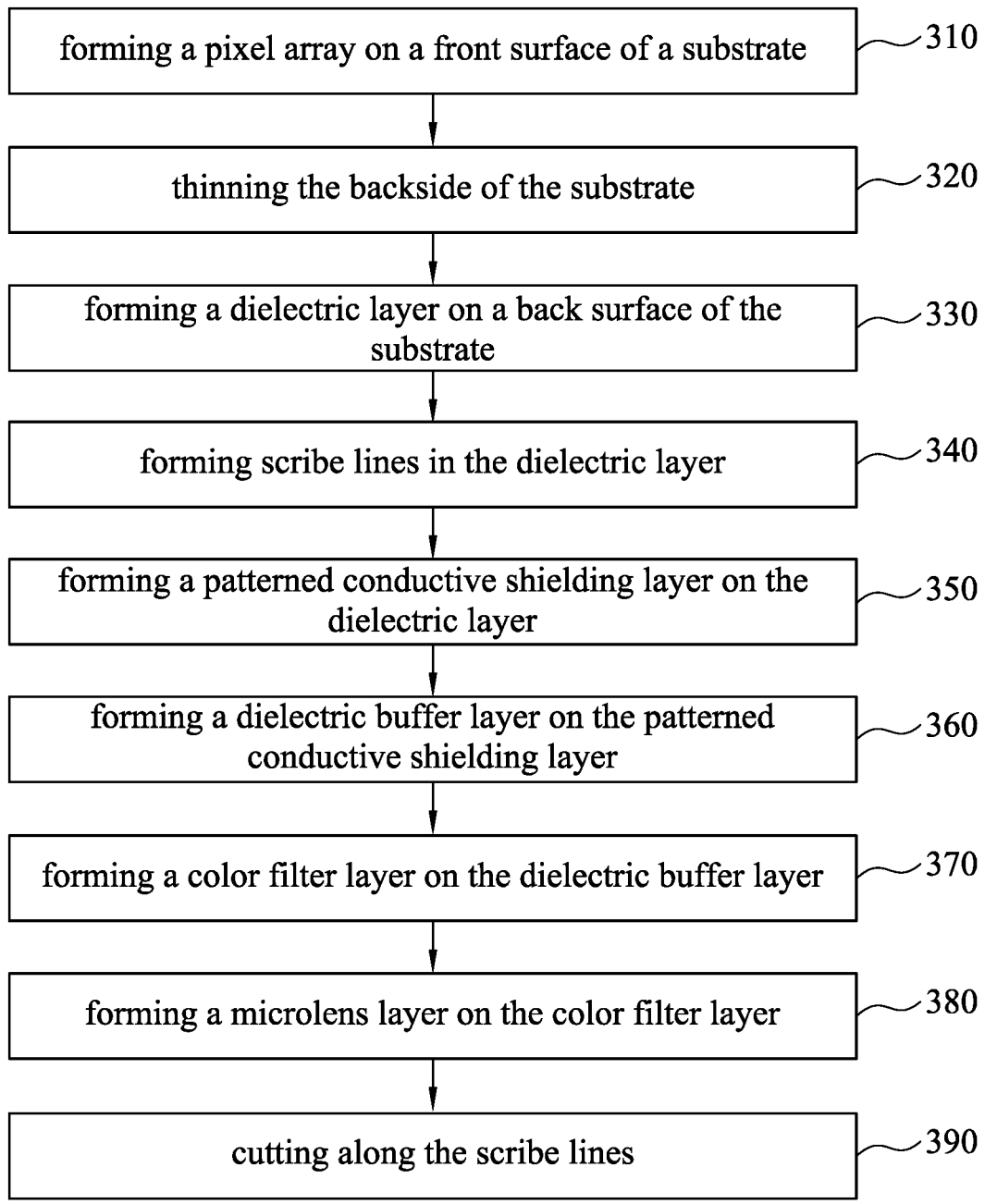
FIG. 3 is a flow chart showing the manufacturing process of a backside illuminated image sensor device with a conductive shielding layer in FIGS. 2A-2C.

In other embodiments, this disclosure provides a method of manufacturing a backside illuminated image sensor device. The backside illuminated image sensor device with a conductive shielding layer in FIG. 1A is taken as an example. Therefore, FIGS. 2A-2C are cross-sectional diagrams showing a manufacturing process of a backside illuminated image sensor device with a conductive shielding layer in FIG. 1A. In addition, FIG. 3 is a flow chart showing the manufacturing process of a backside illuminated image sensor device with a conductive shielding layer in FIGS. 2A-2C. FIGS. 2A-2C and FIG. 3 are referred hereinafter at the same time.

In FIG. 2A and step 310, the pixel array 110 is formed on the front surface of the semiconductor substrate 100. The pixel array 110 includes photodiodes (not shown) in the semiconductor substrate 100 and metal lines 104 in the interconnect layer 102.

In FIG. 2A and step 320, the backside of the substrate 100 is then thinned to reduce the thickness of the substrate 100 to allow light strike the photodiodes in the substrate 100. Next in step 330, a dielectric layer 120 is formed on the back surface of the substrate 100.

In FIG. 2A and step 340, scribe lines 130 are formed in the dielectric layer 120 by patterning the dielectric layer 120. The method of patterning the dielectric layer 120 can be photolithography and etching. In the step of developing photoresist in the photolithography process, since photoresist and the dielectric layer both are electrically insulating material, friction between two insulating materials often produces electrostatic charges to be accumulated. The accumulated electrostatic charges may damage the pixel array 110 if no prevention or protection treatment is made.

In FIG. 2B and step 350, a conductive shielding line 140a is formed on the dielectric layer 120 to protect the structures under the conductive shielding line 140a from discharging damage. The conductive shielding line 140a can be formed by depositing a conductive shielding layer, and then patterning the conductive shielding layer by a method such as photolithography and etching processes. Since the light received intensity by the photodiodes is better to be maximized, the conductive shielding layer 120 is better not cover the backside of the pixel array 110. However, if the conductive shielding line 140a is transparent to light, the conductive shielding line 140a may cover the backside of the pixel array 110 according to various embodiments of this disclosure.

In FIG. 2C and step 360, a dielectric buffer layer 150 is formed on the conductive shielding line 140a and dielectric layer 120. Next in step 370 and step 380, a color filter layer 160 and a microlens layer 170 are sequentially formed on the dielectric buffer layer 150. Finally, the each individual backside illuminated image sensor is separated from each other by cutting along the scribe lines 130.

According to another embodiment of this disclosure, the conductive shielding lines 140b in FIG. 1B or 140c-140d in FIG. 1C can be formed through different photomask used in the above step of patterning the conductive shielding layer. The other steps are the same as the above-described process, and hence are omitted here.

Accordingly, since at least a conductive shielding line is located on the dielectric layer, any outer applied electric field cannot induce the charging effect of the electrostatic charges accumulated under the conductive shielding layer.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A method of manufacturing a backside illuminated image sensor device, the method comprising:
    forming a dielectric layer on a back surface of a semiconductor substrate, wherein the semiconductor substrate has an pixel array formed on a front surface of the semiconductor substrate;
    patterning the dielectric layer to form a plurality of scribe lines surrounding the pixel array;
    forming a conductive shielding layer on the dielectric layer;
    patterning the conductive shielding layer to expose the scribe lines;
    forming a dielectric buffer layer on the patterned conductive shielding layer and the dielectric layer;
    forming a color filter layer on the dielectric buffer layer; and
    forming a microlens layer on the color filter layer.

2. The method of claim 1, wherein the conductive shielding layer is patterned to expose the pixel array.

3. The method of claim 1, wherein the conductive shielding layer is made from a metal, a conductive oxide, a conductive polymer, or graphene.

4. The method of claim 1, wherein a width of the patterned conductive shielding layer is at least 300 μm.

5. The method of claim 1, wherein the dielectric layer is made from a dielectric material having a dielectric constant higher than or equal to the dielectric constant of silicon oxide.

6. The method of claim 1, wherein the dielectric layer is made from silicon oxide or silicon nitride.

7. The method of claim 1, wherein the dielectric buffer layer is made from silicon oxide.

8. The method of claim 1, wherein the pixel array is void of the patterned conductive shielding layer.

9. The method of claim 1, wherein the patterned conductive shielding layer has four separate conductive shielding lines respectively at four corners of the pixel array.

10. A method comprising:
    forming a pixel array on a front-side of a substrate;
    depositing a dielectric layer on a backside of the substrate;
    etching scribe line regions in the dielectric layer;
    after etching the scribe line regions in the dielectric layer, forming one or more conductive shielding lines on the dielectric layer, the one or more conductive shielding lines non-overlapping the pixel array; and
    forming a color filter layer overlapping the pixel array.

11. The method of claim 10, wherein the one or more conductive shielding lines include a shielding line having frame-shaped pattern from a top view.

12. The method of claim 11, wherein from the top view, the pixel array has a quadrilateral pattern enclosed by the frame-shaped pattern of the shielding line.

13. The method of claim 10, wherein from a top view, the one or more conductive shielding lines comprise four first conductive shielding lines respectively at four corners of the pixel array.

14. The method of claim 13, wherein from the top view, the one or more conductive shielding lines comprise four second conductive shielding lines alternately arranged with the first conductive shielding lines and having a different top-view shape than the first conductive shielding lines.

15. The method of claim 14, wherein the first conductive shielding lines have square top-view patterns, and the second conductive shielding lines have rectangular top-view patterns.

16. A method comprising:
forming a pixel array on a substrate;
depositing a dielectric layer on the substrate;
patterning the dielectric layer to form scribe line regions in the dielectric layer; and
forming one or more conductive shielding lines on the dielectric layer, the one or more conductive shielding lines each having an outermost side in vicinity of a boundary of the scribe line regions and an innermost side non-overlapping the pixel array, wherein forming the one or more conductive lines comprises:
depositing a conductive shielding layer on the dielectric layer before patterning the dielectric layer to form the scribe line regions; and
patterning the conductive shielding layer to form the one or more conductive shielding lines.

17. The method of claim 16, wherein the one or more conductive shielding lines comprises a conductive shielding line having a frame-shaped top view.

18. The method of claim 16, wherein the one or more conductive shielding lines comprise four first conductive shielding lines respectively at four corners of the pixel array.

19. The method of claim 18, wherein the one or more conductive shielding lines comprise four second conductive shielding lines alternately arranged with the first conductive shielding lines, and the second conductive shielding lines each have a smaller width than the first conductive shielding lines.

20. The method of claim 16, further comprising:
after patterning the conductive shielding layer, forming a dielectric buffer layer over the one or more conductive shielding lines.

* * * * *